(12) United States Patent
Gu et al.

(10) Patent No.: US 10,510,783 B2
(45) Date of Patent: Dec. 17, 2019

(54) TFT ARRAY SUBSTRATE AND MANUFACTURING METHOD THEREOF, DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Keke Gu, Beijing (CN); Ni Yang, Beijing (CN); Wei Hu, Beijing (CN); Shaoru Li, Beijing (CN); Xin Liu, Beijing (CN); Zhijian Qi, Beijing (CN); Yusong Hou, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 59 days.

(21) Appl. No.: 15/563,587

(22) PCT Filed: May 4, 2017

(86) PCT No.: PCT/CN2017/083011
§ 371 (c)(1),
(2) Date: Sep. 30, 2017

(87) PCT Pub. No.: WO2017/206659
PCT Pub. Date: Dec. 7, 2017

(65) Prior Publication Data
US 2018/0197896 A1  Jul. 12, 2018

(30) Foreign Application Priority Data

Jun. 2, 2016 (CN) .......................... 2016 1 0389132

(51) Int. Cl.
*H01L 27/12* (2006.01)
*G02F 1/1362* (2006.01)
(Continued)

(52) U.S. Cl.
CPC .... *H01L 27/1251* (2013.01); *G02F 1/136286* (2013.01); *H01L 21/77* (2013.01);
(Continued)

(58) Field of Classification Search
None
See application file for complete search history.

(56) References Cited

U.S. PATENT DOCUMENTS 9,165,949 B1  10/2015  Bai et al.
2015/0069378 A1  3/2015  Cha et al.
(Continued)

FOREIGN PATENT DOCUMENTS

CN  103885261 A  6/2014
CN  103972243 A  8/2014
(Continued)

OTHER PUBLICATIONS

Search Report for International Chinese Patent Application No. PCT/CN2017/083011 dated Jul. 26, 2017.
(Continued)

*Primary Examiner* — Alexander G Ghyka
(74) *Attorney, Agent, or Firm* — Calfee, Halter & Griswold LLP

(57) ABSTRACT

A TFT array substrate, its manufacturing method and a corresponding display device are disclosed. The TFT array substrate, includes a bearing substrate, a gate line and a data line arranged across each other on the bearing substrate, a pixel region defined by the gate line and the data line, and a thin film transistor, a pixel electrode and an active layer disposed in the pixel region. Specifically, a gate of the thin
(Continued)

film transistor is connected to the gate line, a source thereof is connected to the data line and a drain thereof is connected to the pixel electrode. Further, an insulating layer is also formed above the source of the thin film transistor, and a drain trench is formed in the insulating layer. In addition, the drain of the thin film transistor is in the drain trench and is connected to the source through the active layer.

15 Claims, 4 Drawing Sheets

(51) Int. Cl.
    *H01L 21/77*     (2017.01)
    *H01L 29/417*     (2006.01)
    *G02F 1/1368*     (2006.01)

(52) U.S. Cl.
    CPC ........ *H01L 27/124* (2013.01); *H01L 27/1244* (2013.01); *H01L 27/1248* (2013.01); *H01L 29/41733* (2013.01); *G02F 1/1368* (2013.01); *G02F 2201/121* (2013.01); *G02F 2201/123* (2013.01); *H01L 2021/775* (2013.01)

(56) References Cited

U.S. PATENT DOCUMENTS

2015/0380433 A1    12/2015    Kim et al.
2017/0160613 A1    6/2017    Wu et al.

FOREIGN PATENT DOCUMENTS

| | | |
|---|---|---|
| CN | 104091831 A | 10/2014 |
| CN | 104393000 A | 3/2015 |
| CN | 105097557 A | 11/2015 |
| CN | 105932026 A | 9/2016 |

OTHER PUBLICATIONS

Second Office Action for Chinese Patent Application No. 201610389132.7 dated Mar. 4, 2019.
First Office Action for Chinese Patent Application No. 201610389132.7 dated Apr. 24, 2018.

TFT ARRAY SUBSTRATE AND MANUFACTURING METHOD THEREOF, DISPLAY DEVICE

RELATED APPLICATION

The present application is the U.S. national phase entry of PCT/CN2017/083011, with an international filing date of May 4, 2017, which claims the benefit of Chinese Patent Application No. 201610389132.7, filed on Jun. 2, 2016, the entire disclosures of which are incorporated herein by reference.

TECHNICAL FIELD

The present disclosure relates to the technical field of display, in particular to a TFT array substrate and its manufacturing method, and a corresponding display device.

BACKGROUND

In the industry of Thin Film Transistor-Liquid Crystal Display (TFT-LCD), rotation of liquid crystal molecules is mainly controlled by the electric field generated between the pixel electrode and the common electrode so as to achieve the effect of displaying images to be displayed. Whether or not the potential of the pixel electrode can reach the required value mainly depends on the on-current Ion of the TFT.

Under the same process conditions, the width-to-length ratio W/L of the TFT has great impact on the performance of the TFT, wherein W is the channel width and refers to the extended distance from the start point to the end point of the channel, and L is the channel length and refers to the distance between the source and drain of the TFT. If other conditions remain the same, larger width-to-length ratio of the TFT means better performance, and the potential of the pixel electrode can reach the required value more easily. An increase in the width-to-length ratio of the TFT can be realized by increasing the channel width W or reducing the channel length L.

However, an increase in the channel width W will also result in an increase in the size of the TFT and a reduction of the aperture ratio. A reduction in the channel length L can both increase the width-to-length ratio of the TFT and reduce the size of the TFT, and can also increase the aperture ratio. Therefore, reducing the channel length L is the best way of increasing the width-to-length ratio of the TFT.

SUMMARY

An object of the present disclosure is to provide a TFT array substrate and its manufacturing method, and a corresponding display device so as to at least eliminate or alleviate one or more of the above-mentioned problems, especially to reduce a channel length L without causing any risk of short-circuit while ensuring the TFT performance, thereby realizing narrow channel design of the array substrate while increasing the aperture ratio of the array substrate.

According to a first aspect of the present disclosure, a TFT array substrate is provided. Said TFT array substrate comprises: a bearing substrate, a gate line and a data line arranged across each other on the bearing substrate, a pixel region defined by the gate line and the data line, and a thin film transistor, a pixel electrode and an active layer disposed in the pixel region. Specifically, a gate of the thin film transistor is connected to the gate line, a source thereof is connected to the data line and a drain thereof is connected to the pixel electrode. Further, an insulating layer is also formed above the source of the thin film transistor, and a drain trench is formed in said insulating layer. In addition, the drain of the thin film transistor is in said drain trench and is connected to the source through the active layer.

In an embodiment of said TFT array substrate, the TFT array substrate has a bottom gate structure, the insulating layer comprises a passivation layer, and the pixel electrode is directly formed above the drain of the thin film transistor.

According to an embodiment of the bottom gate structure, common electrode wires are further provided on the TFT array substrate in both the TN mode (Twisted Nematic liquid crystal mode, a liquid crystal mode in which twist angles of the liquid crystal molecules are 90°) and the ADS mode (Advanced Super Dimension Switch, a mode in which deflection of liquid crystals is caused by a transverse electric field generated by electrodes in the same plane so as to realize image display). Specifically, in the TN mode, each of the common electrode wires is used as a memory capacitor. Correspondingly, in the ADS mode, each of the common electrode wires is used to generate an electric field together with the pixel electrode so as to deflect the liquid crystal molecules. In both the TN mode and the ADS mode, however, common electrode wires of different rows need to be connected through via holes. Thus in the present disclosure, a common electrode insulating layer is provided above the common electrode wires, and common electrode via holes are further formed in such common electrode insulating layer, wherein said common electrode via holes are filled with a drain material.

In the above-described TFT array substrate having the bottom gate structure, via hole connecting wires are directly formed above the drain material.

In addition, in the TFT array substrate having the bottom gate structure, the common electrode via holes and the drain trench are formed in one patterning process, the drain material and the drain are formed in one patterning process, and the pixel electrode and the via hole connecting wires are formed in one patterning process.

In another embodiment of said TFT array substrate, the TFT array substrate has a top gate structure, and the insulating layer comprises an insulating layer between the source and drain of the thin film transistor.

According to a second aspect of the present disclosure, a manufacturing method for a TFT array substrate is provided. Said manufacturing method comprises the following steps: step 1: forming a gate line and a gate, a gate insulating layer, an active layer, and a data line and a source layer by layer on a bearing substrate; step 2: further depositing an insulating layer thin film on the bearing substrate on which the gate line and gate, the gate insulating layer, the active layer and the data line and source are formed, and forming a drain trench in said insulating layer thin film through a patterning process; and step 3: further depositing a drain metal thin film on the bearing substrate on which the drain trench is formed, and forming a drain through a patterning process, said drain being connected to the source through the active layer.

Said step 1, i.e. the step of forming a gate line and a gate, a gate insulating layer, an active layer, and a data line and a source layer by layer on a bearing substrate, specifically includes the following sub-steps: depositing a gate metal layer on the bearing substrate, and forming a gate line and a gate through a patterning process, said gate line being connected to said gate; further depositing a gate insulating layer thin film on the bearing substrate on which the gate line and gate are formed so as to form a gate insulating layer; and further depositing an active layer thin film and a data metal layer thin film on the bearing substrate on which the gate insulating layer is formed, and forming an active layer, a data line and a source, respectively through the patterning process, wherein the data line is connected to the source.

According to a specific embodiment, said manufacturing method further comprises: forming a common electrode wire while forming the gate line and gate through the patterning process.

According to a specific embodiment, said manufacturing method further comprises: forming common electrode via holes in the insulating layer thin film while forming the drain trench through the patterning process, said common electrode via holes being above the common electrode wire.

According to a specific embodiment, said manufacturing method further comprises: filling the common electrode via holes with a drain material while forming the drain through the patterning process.

In addition, according to a specific embodiment, said manufacturing method further comprises further depositing a pixel electrode metal thin film on the bearing substrate on which the drain is formed, and forming a pixel electrode through a patterning process, said pixel electrode being directly connected to said drain.

According to a specific embodiment, said manufacturing method further comprises forming via hole connecting wires while forming the pixel electrode through the patterning process.

According to a third aspect of the present disclosure, another manufacturing method for a TFT array substrate is provided. Said manufacturing method comprises the following steps: step 21: forming an active layer, a data line and a source, respectively on the bearing substrate; step 22: further depositing an insulating layer thin film on the bearing substrate on which the active layer, the data line and the source are formed, and forming a drain trench in said insulating layer thin film through a patterning process; and step 23: further depositing a drain metal thin film on the bearing substrate on which the drain trench is formed, and forming a drain through a patterning process, said drain being connected to the source through the active layer.

According to a specific embodiment, said manufacturing method further comprises: step 24: further forming a gate insulating layer, a gate, a passivation layer and a pixel electrode on the bearing substrate on which the drain is formed.

According to a fourth aspect of the present disclosure, a display device is provided, which comprises the TFT array substrate as described in any one of the above embodiments.

BRIEF DESCRIPTION OF THE DRAWINGS

It shall be noted that the drawings are used to facilitate further understanding of the present disclosure and form a part of the present disclosure. Exemplary embodiments of the present disclosure and descriptions thereof are used to explain the present disclosure, but they do not intend to inappropriately limit the present disclosure. In the drawings:

FIG. 1b is a sectional view along line A-A of the TFT array substrate as shown in FIG. 1a;

FIG. 2b is a sectional view along line B-B of the TFT array substrate as shown in FIG. 2a.

DETAILED DESCRIPTION

To facilitate understanding, the TFT array substrate and its manufacturing method as well as the corresponding display device as provided in the embodiments of the present disclosure are described in detail below with reference to the drawings.

Figure 1A:
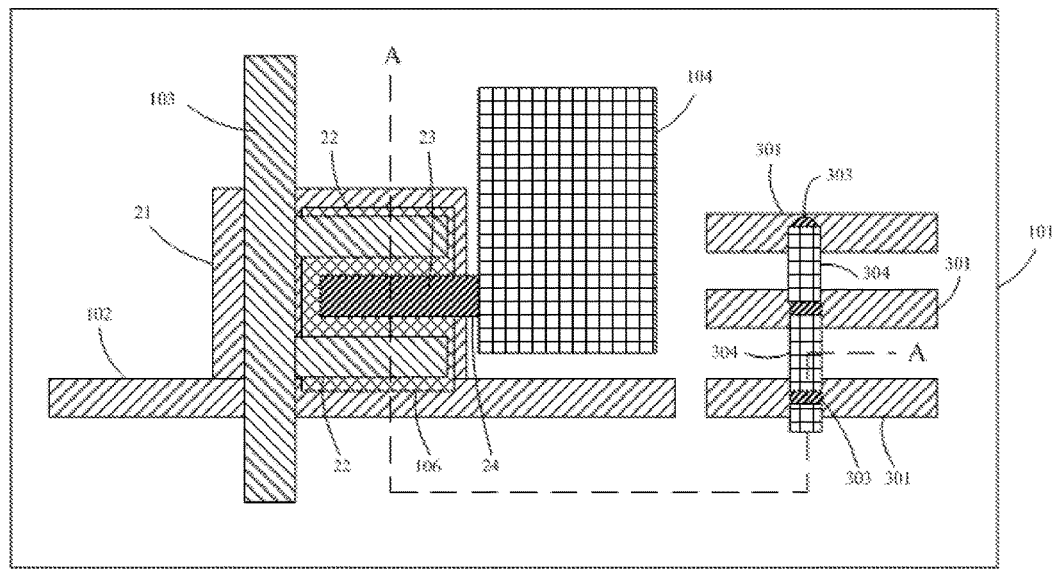
FIG. 1a is a plane view of a TFT array substrate having a bottom gate structure according to an embodiment of the present disclosure.
Figure 1B:
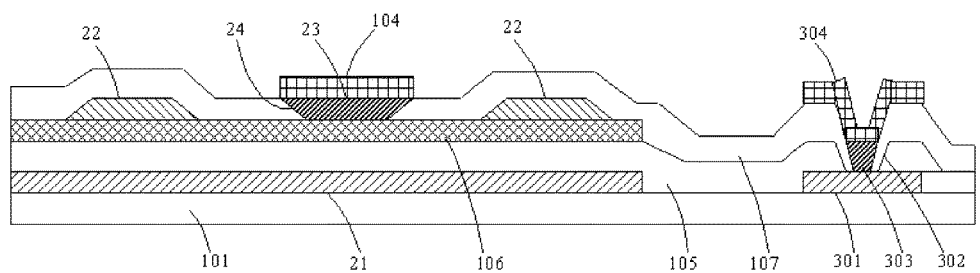

Referring to FIGS. 1a and 1b, the TFT array substrate according to the embodiment of the present disclosure comprises: a bearing substrate 101, a gate line 102 and a data line 103 arranged across each other on the bearing substrate 101, a pixel region defined by the gate line 102 and the data line 103, and a thin film transistor, a pixel electrode 104 and an active layer 106 disposed in the pixel region. Specifically, a gate 21 of the thin film transistor is connected to the gate line 102, a source 22 thereof is connected to the data line 103 and the drain 23 thereof is connected to the pixel electrode 104. Further, in the embodiment having a bottom gate structure as shown in FIGS. 1a and 1b, a passivation layer (which is also called the insulating layer herein) 107 is formed above the source 22, and a drain trench 24 is formed in said passivation layer 107. In addition, a drain 23 is in the drain trench 24, and is connected to the source 22 through the active layer 106.

Typically, in the TFT array substrate, the source and drain are in the same layer and are formed in one patterning process. Therefore, according to such typical TFT array substrate structure and its manufacturing process, reduction in a channel length L will easily cause the risk of short-circuit between the source and the drain, besides, technical implementation thereof is also complex. In this embodiment, however, the drain 23 is in the drain trench 24 in the passivation layer 107. Thus the drain 23 and the source 22 are not in the same layer and are spaced apart by the passivation layer 107. Therefore, the length L of the TFT channel can be reduced without causing the risk of short-circuit between the source 22 and the drain 23. In this way, a design of narrow channel of the array substrate can be realized. Moreover, such design of narrow channel can increase the aperture ratio of the TFT array substrate while ensuring the performance of the TFT.

Figure 1C:
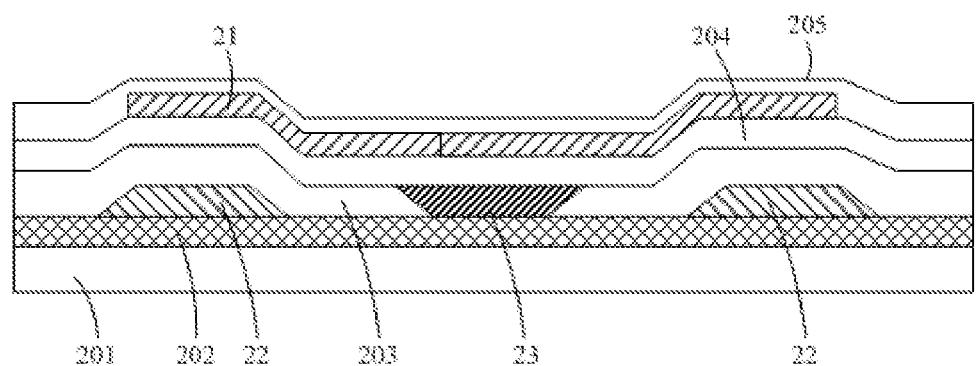
FIG. 1c is a sectional view of a TFT array substrate having one type of top gate structure according to an embodiment of the present disclosure.
Figure 1D:
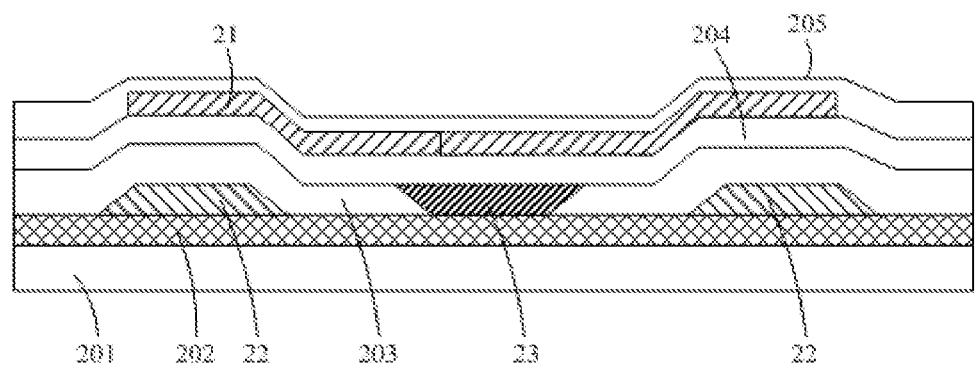
FIG. 1d is a sectional view of a TFT array substrate having another type of top gate structure according to an embodiment of the present disclosure.

In the embodiment of the TFT array substrate having a bottom gate structure, the insulating layer between the source 21 and the drain 22 can be selected to be a passivation layer. As shown in FIGS. 1c and 1d, in the embodiment of the TFT array substrate having a top gate structure, the insulating layer between the source 21 and the drain 22 need to be formed separately.

In the structure shown in FIG. 1c, the TFT array substrate comprises, from bottom to top, a bearing substrate 201, an active layer 202 formed on the bearing substrate 201, a data line and a source 22 formed above the active layer 202, an insulating layer 203 formed above the source 22, a drain 23 formed in the insulating layer 203, a gate insulating layer 204 formed above the drain, a gate line and a gate 21 formed on the gate insulating layer 204, and a passivation layer 205 formed above the gate line and gate 21. In addition, the pixel electrode formed on the passivation layer is not shown in FIG. 1c.

The structure shown in FIG. 1d is similar to that shown in FIG. 1c, and the only difference is that the data line and source 22 are firstly formed on the bearing substrate 201, then the active layer 202 is formed, and the insulating layer 203 is formed above the active layer 202, finally the drain 23 is formed on the insulating layer 203. The rest structures are the same as those shown in FIG. 1c, so they will not be detailed any more.

Likewise, in the TFT array substrate having a top gate structure, the drain 23 and the source 22 are not in the same layer, and they are spaced apart by the insulating layer 203. Therefore, the length L of the TFT channel can be reduced and the risk of short-circuit between the source 22 and the drain 23 can be avoided. In this way, a design of narrow channel of the array substrate can be realized.

In said design of narrow channel of the TFT array substrate having the bottom gate structure or the top gate structure, various different channel shapes are applicable, such as U-shape, double-U-shape, L-shape, semi-circle, or '—' shape, etc.

As an improvement to the above embodiment of the bottom gate structure, the pixel electrode 104 can be directly formed above the drain 23. In a typical TFT array substrate structure, the drain of the TFT needs to be connected to the pixel electrode through a via hole. To this end, a drain metal lead of a large dimension needs to be prepared under the via hole so as to guarantee reliability of connection between the drain and the pixel electrode. However, said metal lead will badly affect the aperture ratio. If the pixel electrode 104 is directly formed above the drain 23, then the drain 23 and the pixel electrode 104 no longer need to be connected through the via hole, but they can be directly connected to each other. Since it is no longer necessary to prepare the metal lead having a large dimension, the aperture ratio of the TFT array substrate can be further increased.

In addition, a plurality of parallel common electrode wires 301 are provided on said TFT array substrate having a bottom gate structure. Said common electrode wires 301 need to be bridged through common electrode via holes in some cases. However, the larger the depth and the number of the via holes, the more likely panel strain will be incurred on the display panel. As an improvement to the above embodiment, common electrode via holes 302 may be formed in a common electrode insulating layer above the common electrode wires 301. In this embodiment, said common electrode insulating layer can be, but is not limited to, the passivation layer 107. Said common electrode insulating layer can be any insulating layer that insulates the parallel common electrode wires from one another. After forming the common electrode via holes 302, a drain material 303 can be filled therein. By filling the common electrode via holes 302 with the drain material 303, hole depths of the common electrode via holes 302 are reduced, and the probability of occurrence of problems like panel strain on the surface of the display panel is reduced.

In some cases, the drain material 303 can even fill the entire common electrode via holes 302, and can enable connection between different common electrode via holes 302. As an improvement, via hole connecting wires 304 can be directly formed above the drain material 303 regardless of whether the drain material 303 has been connected to different common electrode via holes 302. When the drain material 303 fills only part of the common electrode via holes 302, the via hole connecting wires 304 can be connected to different common electrode via holes. When the drain material 303 has been connected to different common electrode via holes, the via hole connecting wires 304 can enhance such connection.

It shall be noted that in this text, the practice of filling the drain material 303 to reduce the via hole depth is not limited to the common electrode via holes 302. In other similar cases, it is also applicable to other types of via holes.

In addition, in the TFT array substrate having a bottom gate structure according to the embodiment of the present disclosure, the common electrode via holes 302 and the drain trench 24 can be formed in one patterning process. Moreover, the drain material 303 and the drain 24 can be formed in one patterning process. Furthermore, the via hole connecting wires 304 and the pixel electrode 104 can be formed in one patterning process. Thus the number of patterning processes can be reduced and the cost can be reduced.

In addition to the above-mentioned TFT array substrate, an embodiment of the present disclosure further provides a manufacturing method for a TFT array substrate having a bottom gate structure. Said manufacturing method specifically comprises the following steps, referring to FIGS. 2a, 2b, 3, 1a and 1b.

Figure 2A:
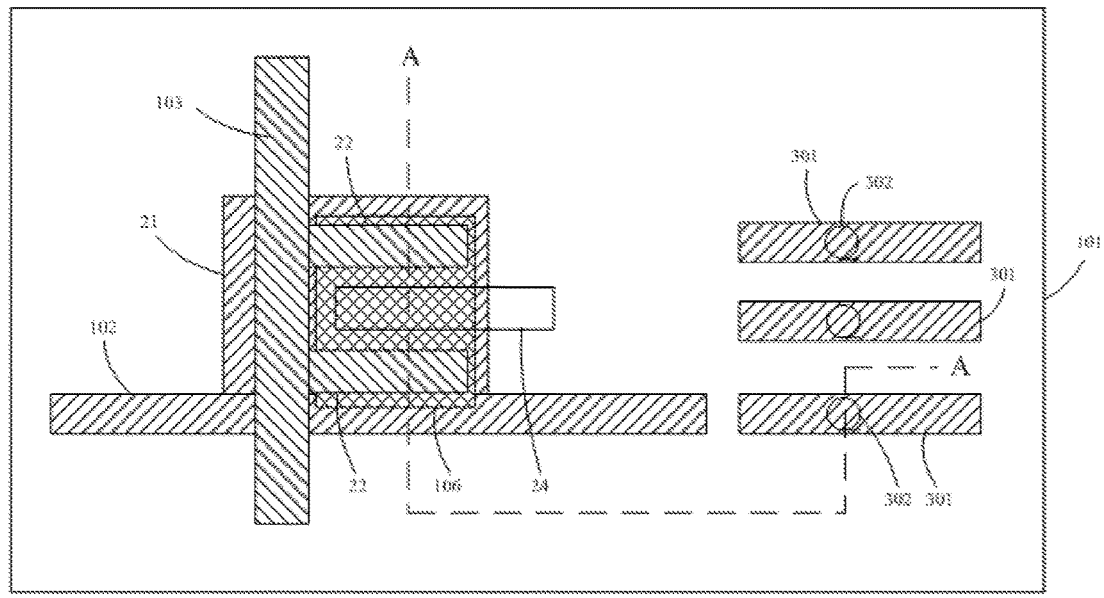
FIG. 2a is a plane view of a gate line and a gate, a gate insulating layer, an active layer and a data line and a source on the TFT array substrate having a bottom gate structure according to an embodiment of the present disclosure.
Figure 2B:
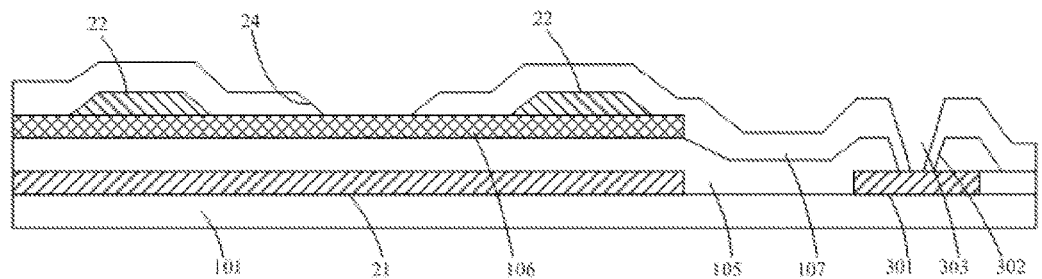

Step 1: forming a gate line 102 and a gate 21, a gate insulating layer 105, an active layer 106, and a data line 103 and a source 22 layer by layer on a bearing substrate 101. As shown in FIGS. 2a and 2b, said step 1 specifically includes the following sub-steps: first, depositing a gate metal layer on the bearing substrate 101, and forming the gate line 102 and gate 21 through a patterning process, said gate line 102 being connected to said gate 21; second, further depositing a gate insulating layer thin film on the bearing substrate 101 on which the gate line 102 and gate 21 are formed, thereby forming a gate insulating layer 105; finally, further depositing an active layer thin film and a data metal layer thin film on the bearing substrate 101 on which the gate insulating layer 105 is formed, and forming the active layer 106, the data line 103 and the source 22, respectively, through patterning processes. It shall be noted that, at this time, the drain 23 is not formed, and the data line 103 is connected to the source 22.

In the above step 1, the drain 23 is not formed, and preparation is made for subsequently forming the drain 23.

According to a specific embodiment, said manufacturing method further comprises: forming common electrode wires 301 on the TFT array substrate while forming the gate line 102 and the gate 22 through the patterning process in said step 1. By forming the gate line 102, the gate 21 and the common electrode wires 301 in one patterning process, the cost can be saved. Moreover, the common electrode wires 301 can be made of an indium tin oxide (ITO) material, and it does not need to use gate metal materials.

Step 2: further depositing an insulating layer thin film on the bearing substrate 101 on which the gate line 102 and gate 21, the gate insulating layer 105, the active layer 106 and the data line 103 and source 22 are formed, and forming the drain trench 23 and passivation layer 107 in the insulating layer thin film through a patterning process. Further, according to a specific embodiment, said manufacturing method further comprises: forming common electrode via holes 302 in said insulating layer thin film while forming the drain trench 24 and the insulating layer 107 through the patterning process in step 2, wherein the common electrode via holes 302 being above the common electrode wires 301. By forming the drain trench 24 and the common electrode via holes 302 in one patterning process, the cost can be saved.

Step 3: further depositing a drain metal thin film on the bearing substrate 101 on which the drain trench 24 and the insulating layer 107 are formed, and forming the drain 23 through a patterning process. In addition, the drain 23 is connected to the source 22 through an active layer 106.

Figure 3:
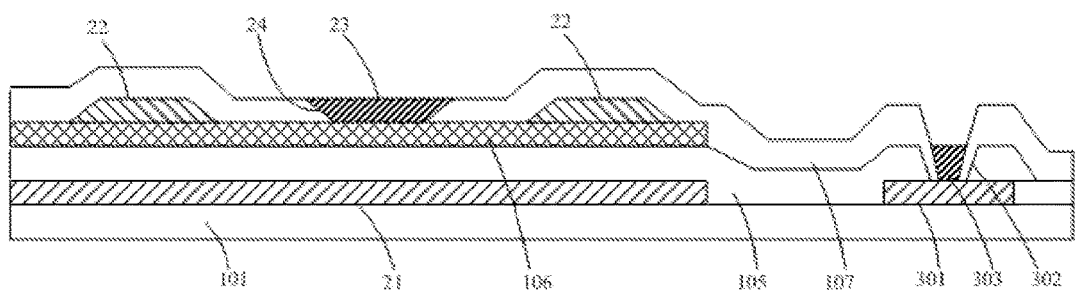
FIG. 3 is a sectional view of the drain on the TFT array substrate having a bottom gate structure according to an embodiment of the present disclosure.

Specifically, as shown in FIG. 3, said manufacturing method comprises: filling the common electrode via holes 302 with the drain material 303 while forming the drain 23 through the patterning process in said step 3. By forming the drain 23 and the drain material 303 in one patterning process, the cost can be saved.

In addition, said manufacturing method may further comprise a step 4, i.e. further depositing a pixel electrode metal thin film on the bearing substrate 101 on which the drain 23 is formed, and forming the pixel electrode 104 through a patterning process, wherein the pixel electrode 104 is directly connected to the drain 23.

According to a specific embodiment, said manufacturing method further comprises: forming via hole connecting wires 304 while forming the pixel electrode 104 through the patterning process in step 4. By forming the pixel electrode 104 and the via hole connecting wires 304 in one patterning process, the cost can be saved.

After said step 4, the formed TFT array substrate has a structure as shown in FIGS. 1a and 1b.

Moreover, an embodiment of the present disclosure further provides a manufacturing method for a TFT array substrate having a top gate structure. Said manufacturing method specifically comprises the following steps:

Step 21: forming an active layer, a data line and a source on a bearing substrate. It shall be noted that in step 21, the order of forming the active layer and the data line and source can be interchanged.

Step 22: further depositing an insulating layer thin film on the bearing substrate on which the active layer, the data line and the source are formed, and forming a drain trench in the insulating layer thin film through a patterning process.

Step 23: further depositing a drain metal thin film on the bearing substrate on which the drain trench is formed, and forming a drain through a patterning process, wherein the drain is connected to the source through the active layer.

According to a specific embodiment, said manufacturing method further comprises: in step 24 after step 23, further forming a gate insulating layer, a gate, a passivation layer and a pixel electrode on the bearing substrate on which the drain is formed.

After step 24, the formed TFT array substrate has a structure as shown in FIGS. 1c and 1d.

Finally, an embodiment of the present disclosure further provides a display device, which comprises the TFT array substrate provided in any of the above embodiments. Said display device can achieve the same technical effect as said TFT array substrate, which will not be elaborated herein.

In the above descriptions of the embodiments, the specific features, structures, materials or characteristics can be combined in appropriate manners in any one or more embodiments or examples.

The above described are merely specific embodiments of the present disclosure, while they do not intend to limit the protection scope of the present disclosure. Any variation or substitution that is easily conceivable by those skilled in the art within the technical scope disclosed by the present disclosure shall fall into the protection scope of the present disclosure. Thus the protection scope of the present disclosure is defined by the appended claims.

LIST OF REFERENCE SIGNS 101, 201—bearing substrate
102—gate line
103—data line
104—pixel electrode
105, 204—gate insulating layer
106, 202—active layer
107, 205—passivation layer
21—gate
22—source
23—drain
24—drain trench
203—insulating layer
301—common electrode wire
302—common electrode via hole
303 drain material
304 via hole connecting wire

The invention claimed is:

1. A TFT array substrate having a bottom gate structure, comprising:
    a bearing substrate,
    a gate line and a data line arranged across each other on the bearing substrate,
    a pixel region defined by the gate line and the data line, and
    a thin film transistor, a pixel electrode and an active layer disposed in the pixel region, a gate of the thin film transistor being connected to the gate line, a source thereof being connected to the data line and a drain thereof being connected to the pixel electrode, wherein
    an insulating layer is also formed above the source of the thin film transistor, and a drain trench is formed in said insulating layer,
    the drain of the thin film transistor is in said drain trench and is connected to the source through the active layer, and
    wherein common electrode wires are further provided on the TFT array substrate, the insulating layer also forms a common electrode insulating layer above the common electrode wires, and common electrode via holes are formed in said common electrode insulating layer, which are filled with a drain material.

2. The TFT array substrate according to claim 1, wherein the insulating layer comprises a passivation layer, and the pixel electrode is directly formed above the drain of the thin film transistor.

3. The TFT array substrate according to claim 1, wherein the drain material fill the entire common electrode via holes to enable connection between different common electrode via holes.

4. The TFT array substrate according to claim 1, wherein via hole connecting wires are directly formed above the drain material, which connect different common electrode via holes.

5. The TFT array substrate according to claim 4, wherein the common electrode via holes and the drain trench are formed in one patterning process,
    the drain material and the drain are formed in one patterning process, and
    the pixel electrode and the via hole connecting wires are formed in one patterning process.

6. A manufacturing method for a TFT array substrate having a bottom gate structure according to claim 1 comprising the steps of:
    forming the gate line and the gate, a gate insulating layer, the active layer, and the data line and the source layer by layer on the bearing substrate, and forming the common electrode wires while forming the gate line and gate through the patterning process;

further depositing an insulating layer thin film on the bearing substrate on which the gate line and gate, the gate insulating layer, the active layer, the data line, the source, and the common electrode wires are formed, and forming the drain trench, the insulating layer and the common electrode via holes in said insulating layer thin film through a patterning process; and further depositing a drain metal thin film on the bearing substrate on which the drain trench and common electrode via holes is formed, and forming the drain, the insulating layer and filling the common electrode via holes with the drain material through a patterning process, said drain being connected to the source through the active layer.

7. The manufacturing method according to claim 6, wherein the step of forming a gate line and a gate, a gate insulating layer, an active layer, and a data line and a source layer by layer on a bearing substrate includes the following sub-steps:

depositing a gate metal layer on the bearing substrate, and forming a gate line and a gate through a patterning process, said gate line being connected to said gate;

further depositing a gate insulating layer thin film on the bearing substrate on which the gate line and gate are formed so as to form the gate insulating layer; and further depositing an active layer thin film and a data metal layer thin film on the bearing substrate on which the gate insulating layer is formed, and forming the active layer, the data line and the source, respectively through a patterning process, wherein the data line is connected to the source.

8. The manufacturing method according to claim 6, which further comprises:

filling the common electrode via holes with a drain material such that the drain material fill the entire common electrode via holes while forming the drain through the patterning process.

9. The manufacturing method according to claim 6, which further comprises:

further depositing a pixel electrode metal thin film on the bearing substrate on which the drain is formed, and forming said pixel electrode through a patterning process, said pixel electrode being directly connected to said drain.

10. The manufacturing method according to claim 9, which further comprises:

forming a via hole connecting wire while forming the pixel electrode through the patterning process.

11. A display device, which comprises the TFT array substrate according to claim 1.

12. The display device according to claim 11, wherein the TFT array substrate has a bottom gate structure, the insulating layer comprises a passivation layer, and the pixel electrode is directly formed above the drain of the thin film transistor.

13. The display device according to claim 11, wherein the drain material fill the entire common electrode via holes to enable connection between different common electrode via holes.

14. The display device according to claim 11, wherein via hole connecting wires are directly formed above the drain material, which connect different common electrode via holes.

15. The display device according to claim 14, wherein the common electrode via holes and the drain trench are formed in one patterning process, the drain material and the drain are formed in one patterning process, and the pixel electrode and the via hole connecting wires are formed in one patterning process.

* * * * *